Jan. 21, 1964 V. R. SAARI 3,119,077

AUTOMATIC GAIN CONTROL CIRCUIT USING VARIABLE ATTENUATORS IN THE SIGNAL PATCH

Filed Dec. 9, 1960

INVENTOR
V. R. SAARI
BY

ATTORNEY

United States Patent Office 3,119,077

Patented Jan. 21, 1964

3,119,077

AUTOMATIC GAIN CONTROL CIRCUIT USING VARIABLE ATTENUATORS IN THE SIGNAL PATH

Veikko R. Saari, Chatham, N.J., assignor to Bell Telephone Laboratories, Incorporated, New York, N.Y., a corporation of New York Filed Dec. 9, 1960, Ser. No. 74,970
5 Claims. (Cl. 330—145)

Figure 1:
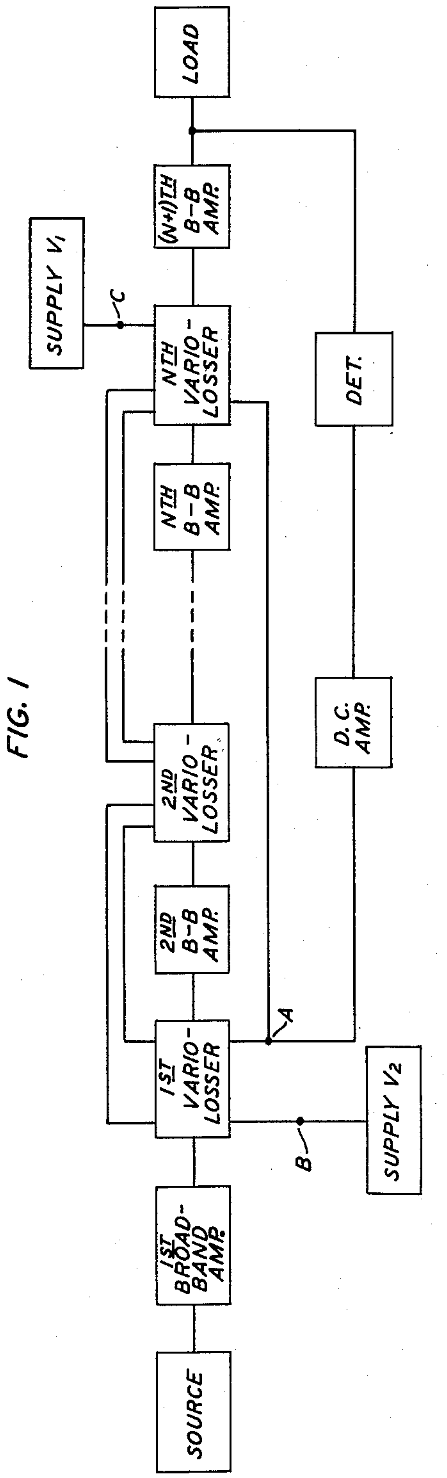

This invention relates to automatic gain control circuits and particularly to automatic gain control circuits having a large dynamic range and suited for use in wide-band amplifiers.

One form of automatic gain control found useful in broad-band amplifiers, and particularly when transistorized circuits are employed, involves the use of one or more variable attenuators or variolossers located in the signal path and controlled in response to the output level of the amplifier. Such an automatic gain control circuit is disclosed in my copending application, Serial No. 10,673, filed February 24, 1960, which issued February 7, 1961 as U.S. Patent 2,971,164.

In some applications of this kind of automatic gain control circuit, the total loss required to keep the output of the wide-band amplifier within desired limits is greater than can be provided with a single variolosser network. While one can, in theory, increase the available loss indefinitely by adding meshes to the loss network, practical considerations set a definite limit to this approach.

The problems that arise when a large amount of attenuation is necessary to keep the signal strength at the output of the wide-band amplifier substantially constant are increased noise and stray coupling which produce distortion. These effects occur when a unitary variolosser is employed because too much loss is introduced in too small a physical area and it becomes substantially impossible to obtain a satisfactory ground as required to prevent stray currents within the loss network. Also, when too much loss is introduced in one area, the signal strength in the balance of the amplifier is decreased to such an extent that the ratio of the noise to the signal in the system becomes excessive.

Since it is desirable to reduce the amount of loss introduced in any one area, it would appear logical to use a plurality of variolossers disposed in tandem and coupled between several different stages in the wide-band amplifier. However, this does not necessarily rectify the existing problems because one variolosser may operate at a much different level than the others and thus introduce the majority of the attenuation. It follows that the same problems will result.

It is accordingly the object of the present invention to improve automatic gain control circuitry for broad-band amplifiers and to eliminate effects of the stray coupling and increased noise in circuits of wide dynamic control range.

In accordance with the invention, therefore, unitary variolossers, having series and shunt branches connected in tandem between the stages of the broad-band amplifier, are controlled together to maintain a desired output level. For this purpose, arrangements are made to pass a first bias current through all of the series branches of the variolossers and a second bias current through all of the shunt branches of the variolossers so that the total loss to the signal passed by the broad-band amplifier will be equally distributed between the different variolossers. Where, as disclosed in my copending application, the variolossers each consist of a diode ladder network of any number of meshes containing means for maintaining the input and output impedance constant, the diodes in the series branches of all of the variolossers are connected in series between two nodes, one having a first constant voltage and the other having a variable voltage; and the diodes in the shunt branches of all of the variolossers are connected in series between another two nodes, one having a second constant voltage and the other having a variable voltage. The variable voltage in each case is the gain control signal fed back from the output of the broad-band amplifier to control the attenuation of the signal passed through the variolossers.

The series branches of the different variolossers will have substantially equal impedances because the same bias current flows through all of them in common. This is equally true for each shunt branch of the different variolossers in that their common bias current will provide the same impedance in each shunt branch. The common currents of the series and shunt branches cause the different variolossers to track; that is, the signal attenuations of the several variolossers are substantially equal at all times.

Figure 2:
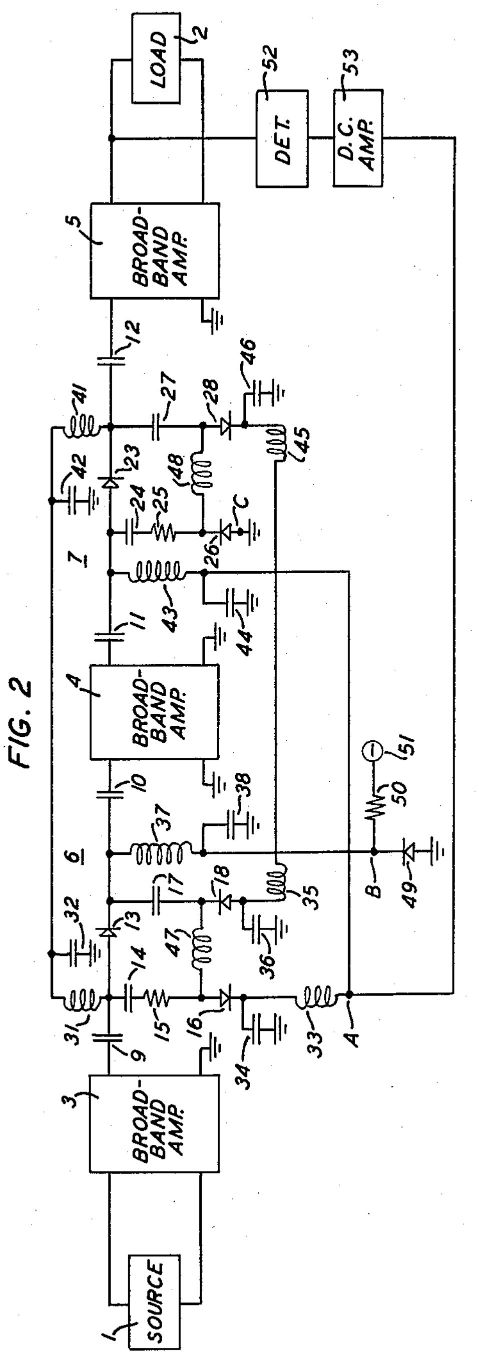

These and other features and advantages of the invention will appear more clearly and fully upon consideration of the following specification taken in connection with the drawing in which:

FIG. 1 is a block diagram of an automatic gain control circuit in accordance with the present invention; and FIG. 2 is a schematic circuit diagram of a preferred embodiment, in accordance with the present invention, of the automatic gain control circuit shown generally in FIG. 1.

FIG. 1 represents a broad-band amplifier with a plurality of variolossers dispersed between different amplifier stages to provide automatic gain control in accordance with the invention. This amplifier, which comprises N+1 broad-band amplifier stages, together with auxiliary circuitry, is shown as being connected between a source and a load. By way of example, the broad-band amplifier may be thought of as the intermediate-frequency amplifier of a radio receiver. In this case, the source comprises the mixer and preceding circuitry, and the load comprises the detector or demodulator and succeeding circuitry of the receiver. Dispersed between the different amplifier stages are N unitary variolossers. The series branches of the N variolossers are connected in series between two voltage nodes A and B, while the shunt branches are connected in series between two voltage nodes A and C. Nodes B and C represent the points of application of the constant bias voltages of the series and shunt branches, respectively. Node A represents the point of application of the variable voltage which is the gain control signal fed back from the output of the broad-band amplifier through the detector and direct-current amplifier to control the attenuation of the signal passed through the variolossers.

The detailed circuitry of the automatic gain control circuit may now be more fully considered in connection with FIG. 2.

In the preferred embodiment of the automatic gain control circuit, in accordance with the invention, as shown in FIG. 2, the broad-band amplifier is connected between a source 1 and a load 2. The broad-band amplifier comprises broad-band amplifier stages 3, 4, and 5 with unitary variolossers 6 and 7 connected therebetween.

Variolosser 6 is coupled to the output of broad-band amplifier stage 3 through direct-current blocking capacitor 9 and to the input of amplifier stage 4 through direct-current blocking capacitor 10, while variolosser 7 is coupled to the output of amplifier stage 4 through direct-current blocking capacitor 11 and to the input of amplifier stage 5 through direct-current blocking capacitor 12. The variolossers 6 and 7 may be any variable attenuator which will perform the desired gain control function. However, variolossers 6 and 7 are shown, by way of example, to be diode ladder networks similar to the ones disclosed in my copending application. Thus, variolosser 6, which is representative, comprises a series connection between the output of amplifier stage 3 and the input of amplifier stage 4 which comprises a series diode 13. Across the output of amplifier stage 3 is connected a shunt branch which comprises the series connection of two capacitors 14 and 34, resistor 15, and diode 16. Variolosser 6 further includes a second shunt branch comprising the series connection of two capacitors 17 and 36, and diode 18 connected across the input of amplifier stage 4.

Variolosser 7, which is connected between amplifier stage 4 and amplifier stage 5 is essentially identical to variolosser 6. The series branch comprises a diode 23, while the input and output shunt branches comprise, respectively, the series connection of capacitor 24, resistor 25, and diode 26 and the series connection of capacitors 27 and 46, and diode 28.

The direct-current bias supplies of variolossers 6 and 7 are effectively isolated from the broad-band signal supplied by source 1 and amplified by the broad-band amplifier by the provision of decoupling filters. The decoupling filters of variolosser 6 comprise radio-frequency choke 31 and capacitor 32, radio-frequency choke 35 and capacitor 36, radio-frequency choke 37 and capacitor 38, and radio-frequency choke 33 and capacitor 34. The corresponding decoupling filters of variolosser 7 comprise radio-frequency choke 41 and capacitor 42, radio-frequency choke 45 and capacitor 46, and radio-frequency choke 43 and capacitor 44. It is noted that there is not a decoupling filter in variolosser 7 corresponding to radio-frequency choke 33 and capacitor 34 of variolosser 6. However, if there were a direct-current source placed between point C and ground, it would be necessary to place a decoupling filter in this branch of variolosser 7, which would then correspond to the last-mentioned filter of variolosser 6. These decoupling filters also prevent stray coupling between the several variolossers.

Variolossers 6 and 7 are made to track, that is, to present equal attenuation to the signal, by connecting the series branch diodes 13 and 23 in series direct-current wise between the two voltage nodes A and B and by connecting the shunt branch diodes 16, 18, 26, and 28 in series direct-current wise between the two voltage nodes A and C. In variolossers 6 and 7, the direct-current series path between the diodes in the shunt branches is made to appear as an open circuit to the broad-band signal passed by the variolosser by the insertion of radio-frequency choke 47 between diodes 16 and 18 in variolosser 6 and radio-frequency choke 48 between diodes 26 and 28 in variolosser 7.

It will be noted that the voltage nodes A, B, and C of FIG. 2 correspond to the voltage nodes A, B, and C of FIG. 1. The value of the voltages at points A, B, and C will be determined by the desired range of operation and the characteristics of the non-linear impedance elements in the variable attenuators.

The range of operation and the characteristics of the diodes employed in the variolossers in this preferred embodiment of the invention are such that the voltages applied at points A, B, and C will not cause the diodes to become reverse biased. However, the variation of the voltage applied at point A is such that the diode voltages in the series and shunt branches may effectively be made alternately equal to zero volts, thereby providing a sufficiently large impedance as compared to that presented by the diodes when operating in their normal forward-biased condition. Therefore, point C is connected to a voltage node which in FIG. 1 is connected generally to some supply voltage while in this preferred embodiment it is connected essentially to the ground reference of the system, and point B is connected to a sufficiently large constant negative potential. This constant voltage at point B is supplied by connecting this point to the junction of diode 49 and resistor 50, which comprises a voltage divider circuit across a source of negative potential 51. The potential at point B is made substantially constant by the action of diode 49. Diode 49 may be a single diode or may be a plurality of diodes, depending upon the potential desired at point B, the constant potential node for the series branches of the variolossers. Diode 49 may also be chosen to have a particular temperature characteristic as one of the possible means of controlling the effect of temperature on the loss-frequency characteristics of the variolossers.

The variable voltage, which is the gain control signal fed back from the output of the broad-band amplifier to control the attenuation of the signal passed through the variolossers, is applied to the variolossers at point A. This voltage applied at point A varies in accordance with the strength of the signal passed by the broad-band amplifier as it appears at the input to a detector 52 which is connected to the output of amplifier stage 5 and samples the signal strength at this point. Detector 52 changes this signal into a direct or low frequency current. This direct current is amplified with respect to a fixed reference level by a direct-current amplifier 53 and is then applied as the variable voltage to point A.

The normal operating condition of the circuit is chosen as that existing when the broad-band input signal from source 1 is substantially maximum. Under this condition the relative bias voltages on the diodes in variolossers 6 and 7 are made such that shunt diodes 16, 18, 26, and 28 are biased in their forward direction of least impedance while the series diodes 13 and 23 are effectively biased at zero volts, thereby presenting a very large impedance.

When the input signal from source 1 is applied to variolosser 6, it will be developed mainly across the large impedance of diode 13 rather than the small impedance of the shunt branch of the series connection of capacitor 17, diode 18, and capacitor 36. Therefore, only a small portion of the input signal to the variolosser appears as an input signal to amplifier stage 4. This small portion of the input signal will be amplified by amplifier stage 4 and applied to variolosser 7. The signal in variolosser 7 will be developed mostly across the series diode 23 and only a small portion thereof will appear as an input signal to amplifier stage 5 across the series connection of capacitor 27, diode 28, and capacitor 46. Thus, variolosser 6 introduces a large attenuation in the interstage coupling between amplifier stages 3 and 4, and variolosser 7 introduces an equally large attenuation in the interstage coupling between amplifier stages 4 and 5. This is true because a common bias current is flowing through the series diodes 13 and 23 and another common bias current is flowing through the shunt diodes 18 and 28. Therefore, the same relative proportion of input signal will appear at the output of variolosser 7 as appears at the output of variolosser 6.

The input signal from source 1, which is assumed to be, by way of example, the front end of a radio receiver, may decrease in strength or fade because of a disturbance in the transmission medium to which the receiver is coupled. When the strength of the input signal from source 1 decreases substantially below that existing during the normal operating conditions, the detected signal fed back from the output and applied at point A will decrease toward zero volts. Thereafter, the voltage appearing across the series connection of the shunt diodes 16, 18, 26, and 28 will effectively approach zero, thereby substantially increasing the impedance presented by these shunt diodes. The voltage appearing across the series connection of series diodes 13 and 23 will now be of such a value that the series diodes will be substantially forward biased, thereby presenting a greatly reduced impedance. Under this condition of decreased input signal strength, the input signal of variolosser 6 will be developed mainly across shunt diodes 16 and 18 rather than series diode 13 and therefore a larger portion of the input signal to variolosser 6 will appear as an input to amplifier stage 4. In this condition of decreasing signal strength, the attenuation to the signal by variolosser 6 is reduced. However, the signal strength applied to amplifier stage 4, while being reduced, is only slightly reduced compared to the reduction in the strength of the input signal to amplifier stage 4 under normal operating conditions.

A similar effect takes place in variolosser 7, whereby the input signal to this variolosser will be developed mainly across shunt diodes 26 and 28, thereby allowing a larger portion of the input signal to appear as an input to amplifier stage 5. Thus, the signal level appearing at the input to the last amplifier stage, and therefore the load, remains substantially constant at all times by the over-all action of the several variolossers. The decrease of the attenuation of the signal passed by variolosser 6 is substantially equal to the decrease in the attenuation of the signal passed by variolosser 7 by the fact that all shunt diodes present substantially the same impedance and all series diodes present substantially the same impedance.

The variolossers disclosed and described above may be replaced by any variable attenuator which will provide the desired attenuation to make the signal level at the output of the broad-band amplifier remain substantially constant and has series and shunt branches that may be interconnected so that there will be tracking of the several attenuators. It may be desirable under some circumstances to replace the constant input impedance variolosser disclosed above by a variolosser that has increased resistance provided by individual resistors in the series branch. This is the case when the characteristics of the diodes are such that they do not individually present a high enough impedance to effect the desired operation.

What is claimed is:

1. In a multistage broad-band amplifier, a plurality of amplifier stages, means for connecting said stages in tandem between a source and a load, a plurality of variolossers, each variolosser being included in the connecting means between the output of one amplifier stage and the input of the next-succeeding amplifier stage, each variolosser having a voltage-controlled variable impedance element in a series path between said amplifiers and at least one shunt path including a voltage-controlled variable impedance element, a first current source, a second current source, means for electrically connecting in series the variable impedance elements of the series paths of said variolossers to said first source, means for electrically connecting in series the variable impedance elements of the shunt paths of said variolossers to said second source, and means responsive to the strength of the signal passed by said broad-band amplifier for producing a variation of the currents supplied by said sources.

2. In combination, a broad-band amplifier connected between a source and a load, said broad-band amplifier comprising N+1 amplifier stages, N variable attenuators connected between different amplifier stages, each variable attenuator having a variable impedance series path and two variable impedance shunt paths, a first voltage node having a first constant voltage applied thereto, a second voltage node having a second constant voltage applied thereto, a third voltage node having a variable voltage applied thereto, means connected between the output of said broad-band amplifier and said third node for supplying said variable voltage in response to the signal strength from said source, means for electrically connecting the series paths of said variable attenuators in series between said first and third nodes, and means for electrically connecting said shunt paths of said variable attenuators in series between said second and third nodes.

3. In a multistage broad-band amplifier, a plurality of amplifier stages, means connecting said stages in tandem between a source and a load, a plurality of variolossers, each variolosser being included in the connecting means between the output of one amplifier stage and the input of the next-succeeding amplifier stage, each variolosser having a diode in a series path between said amplifiers and at least a first shunt path including a diode, means for initially biasing the diodes in said shunt paths in their forward direction of least impedance, said shunt biasing means providing a current common to all of the diodes in said shunt paths, means for initially biasing the diodes in said series paths in other than their forward direction of least impedance, said series biasing means providing a current common to all of the diodes in said series paths, and means responsive to the strength of the signal passed by said broad-band amplifier for producing a variation in said initial biasing to vary the impedance of said diodes.

4. In a multistage broad-band amplifier, a plurality of amplifier stages, means connecting said stages in tandem between a source and a load, a plurality of variolossers, each variolosser being included in the connecting means between the output of one amplifier stage and the input of the next-succeeding amplifier stage, each variolosser having a variable impedance element in a series path between said amplifiers and at least one shunt path including a variable impedance element, means responsive to the strength of the signal passed by said broad-band amplifier for generating first and second variable currents, means for directing said first current through the variable impedance elements of all series paths, and means for directing said second current through the variable impedance elements of all shunt paths.

5. In combination, a source of broad-band signals, a load for utilizing said signals, a first attenuating network connected to said source, a second attenuating network connected to said load, an amplifying network interconnecting said attenuating networks, each of said attenuating networks having an input terminal and an output terminal, each of said attenuating networks having a series path between said input and output terminals, said series path comprising a non-linear impedance element, each of said attenuating networks having a shunt path across its input comprising a capacitor and a non-linear impedance element and a shunt path across its output comprising a capacitor and a non-linear impedance element, a constant voltage source, a ground reference, a variable voltage source, said variable voltage source comprising a detector for sampling the strength of the signal at said load and rectifying this sample and a direct-current amplifier for amplifying said rectified sample, means for electrically connecting the non-linear impedance elements in the series branch of said attenuating networks between said constant voltage source and said variable voltage source, and means for electrically connecting in series the non-linear impedance elements in said shunt branches between said variable voltage source and said reference ground.

References Cited in the file of this patent

UNITED STATES PATENTS

| | | |
|---|---|---|
| 2,228,866 | Bjornson | Jan. 14, 1941 |
| 2,935,697 | McManis | May 3, 1960 |